(12) United States Patent
Otoma et al.

(10) Patent No.: US 6,898,226 B2
(45) Date of Patent: May 24, 2005

(54) SURFACE EMITTING SEMICONDUCTOR LASER AND PROCESS FOR PRODUCING THE SAME

(75) Inventors: Hiromi Otoma, Kanagawa (JP); Jun Sakurai, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/315,152

(22) Filed: Dec. 10, 2002

(65) Prior Publication Data

US 2003/0169795 A1 Sep. 11, 2003

(30) Foreign Application Priority Data

Dec. 19, 2001  (JP) ........................................ 2001-386815

(51) Int. Cl.[7] .............................................. H01S 5/00
(52) U.S. Cl. ......................................... 372/45; 372/46
(58) Field of Search ................................ 372/75, 43–50

(56) References Cited

U.S. PATENT DOCUMENTS

| | | | | |
|---|---|---|---|---|
| 5,493,577 A | * | 2/1996 | Choquette et al. | ............ 372/46 |
| 6,014,400 A | * | 1/2000 | Kobayashi | .................. 372/96 |
| 6,144,682 A | * | 11/2000 | Sun | .............................. 372/45 |
| 6,201,825 B1 | * | 3/2001 | Sakurai et al. | ................ 372/96 |
| 6,207,973 B1 | * | 3/2001 | Sato et al. | ..................... 257/98 |
| 6,301,281 B1 | * | 10/2001 | Deng et al. | .................... 372/45 |
| 6,320,893 B1 | * | 11/2001 | Ueki | ............................. 372/96 |
| 6,529,541 B1 | * | 3/2003 | Ueki et al. | ..................... 372/96 |

OTHER PUBLICATIONS

Ueki et al., "Single–Transverse–Mode 3.4–mW Emission of Oxide–Confined 780–nm VCSEL's", IEEE Photonics Technology Lettes, vol. 11, No. 12, pp. 1539–1541, Dec., 1999.

* cited by examiner

Primary Examiner—Minsun Oh Harvey
Assistant Examiner—Tuan N. Nguyen
(74) Attorney, Agent, or Firm—Oliff & Berridge, PLC

(57) ABSTRACT

A surface emitting semiconductor laser includes a substrate, a first semiconductor multilayer reflector formed on the substrate, an active region formed on the first semiconductor multilayer reflector, a second semiconductor multilayer reflector formed on the active region, a current confinement layer interposed between the first and second semiconductor multilayer reflectors and partially including an oxide region, and an insulating layer formed on a coated surface provided by a semiconductor layer which is part of the first semiconductor multilayer reflector and is revealed after removal of a surface oxidation layer.

11 Claims, 9 Drawing Sheets

417 INTERLAYER INSULATOR
414

418
409
417

418
409
419 WIRING LINE
417
419

SURFACE EMITTING SEMICONDUCTOR LASER AND PROCESS FOR PRODUCING THE SAME

BACKGROUND OF THE INVENTION

1. Field of the Invention

The present invention relates to a surface emitting semiconductor laser typically used for optical interconnections, optical switch and optical information processing, and a process for producing such a laser.

2. Description of the Related Art

Recently, there has been considerable activity in the development of optical interconnections directed toward dramatically improved transmission rates as means for transmitting information between logic circuit elements. Attention is attracted to a surface emitting semiconductor laser that enables light-emitting elements to be densely arranged in two dimensions as a parallel source. Such a laser is frequently called vertical cavity surface emitting laser diode (which will be hereinafter referred to as VCSEL simply). Pioneer researches in the VCSEL have been conducted by Iga et al. and are summarized in IEEE Photon, Tech. Lett. Vol. 11, No. 12, December 1999, ppp. 1539.

Referring to FIGS. 5A and 5B, a recent structure of the VCSEL has a resonator 702 that vertically extends from the horizontal surface of a semiconductor substrate 701. The resonator 702 has a mesa structure, and includes an active layer 703, a lower reflection mirror 704, an upper reflection mirror 705, and a spacer layer 706. The active layer 703 confines a carrier and results in light. Each of the mirrors 704 and 705 is made up of a plurality of semiconductor layers. The spacer layer 706 makes phase matching of the light emitted by the active layer 703 at the ends of the reflection mirrors 704 and 705. On the upper reflection mirror 705, provided are an upper contact layer 707, an upper electrode 708, an interlayer insulating film 710 and a lower electrode 709 in this order. The upper electrode 708 defines an aperture via which the laser beam is emitted. The interlayer insulating film 710 covers the sidewall and upper edge portions of the mesa structure.

Laser oscillation is conducted by confining the carrier and light in the horizontal direction in addition to the vertical direction. A confinement structure in the horizontal direction with respect to the substrate may be constructed by any of the following methods. The first method employs dry etching by which a boss (post or mesa) structure as thin as about ten and a few microns is formed. The second method is of oxidization type. A post structure having a diameter as large as tens of microns by dry etching and the property of an AlAs layer called control layer is partially changed into insulation by moisture vapor oxidation so that a restricted current path can be defined. The third method is of implantation type. The third method forms an insulating region by proton implantation and results in the restricted current path. At present, it is acknowledged that the oxide-confined VCSEL has a comparatively low threshold current and exhibits an excellent optical characteristic as a function of current. This is described in, for example, Journal of Solid State Physics and Applications Division, Vol. 5, No. 1, 1999, pp. 11. In FIGS. 5A and 5B, an oxide region in the AlAs layer 712 is indicated by a reference numeral 712A, and a non-oxide region therein is indicated by a reference numeral 712B. An aperture 713 is formed in the upper electrode 708 and the laser beam is emitted via the aperture 713. FIG. 5A and 5B differ from each other in that the semiconductor layer on which the interlayer film located on the bottom of the mesa structure is formed is a surface-oxidized layer 714 of a GaAs layer of the semiconductor substrate 701 or a surface-oxidized layer 715 of an AlGaAs layer that is part of the lower reflection mirror 704. The above difference results in a difference in the post height.

A description will now be given, with reference to FIGS. 6A through 6F, of steps of the process for producing the oxide type VCSEL until the interlayer insulating film is provided.

Referring to FIG. 6A, on an n-type GaAs semiconductor substrate 801, provided are an n-type GaAs buffer layer 802, a distributed Bragg reflector layer (DBR layer) 803, a λ (one wavelength) $Al_{0.6}Ga_{0.4}As$ spacer layer 804, an AlAs layer 807, a DBR layer 808 and a p-type GaAs cap layer 809 in this order by MOCVD (Metalorganic Chemical Vapor Deposition). The DBR layer 803 is composed of 35 n-type $Al_{0.3}Ga_{0.7}As/Al_{0.9}Ga_{0.1}As$ layers. The spacer layer 804 has two $Al_{0.10}Ga_{0.90}As$ quantum well active layers 805, and three $Al_{0.30}Ga_{0.70}As$ barrier layers 806. One of the two layers 805 is sandwiched between two of the barrier layers 806, and the other layer 805 is sandwiched between two of the layers 806. It is to be noted that FIG. 6A shows only one barrier layer 806, and the two remaining barrier layers 806 provided on the upper surface of the upper active layer 805 and the lower surface of the lower active layer 805 are omitted for the sake of simplicity. It may be said that the barrier layers 806 that are omitted from illustration are interposed between the active layers and the spacer layers. The DBR layer 808 is composed of 28 p-type $Al_{0.3}Ga_{0.7}As/Al_{0.9}Ga_{0.1}As$ pairs. The cap layer 809 functions as a contact layer. The layers thus laminated form a VCSEL substrate.

Next, as shown in FIG. 6B, a resist pattern for forming a contact electrode on the p-type GaAs cap layer of the VCSEL substrate is formed by the conventional photolithograph process (PLP). Then, an electrode metal such as Cr/Au or Ti/Au is deposited. Subsequent liftoff of the resist results in contract electrodes 810.

Then, as shown in FIG. 6C, an insulating film such as a SiON or $SiO_2$ film acting as a mask in dry etching is deposited in order to define the post or mesa structure. Then, the insulating film is etched by buffered hydrofluoric acid (BHF) wherein resist formed by the conventional PLP is used as the mask. Thereby, an insulating mask 811 is defined.

As shown in FIG. 6D, the wafer is dry-etched in a mixture gas of $BCl_3$ and $Cl_2$ with the mask pattern 811 of the insulating film. This results in a post structure 812 on the VCSEL substrate. The height of the post structure may be defined by the any of two ways of etching described below. The first way of etching progresses beyond the DBR layer 803 composed of 35 n-type $Al_{0.3}Ga_{0.7}As/Al_{0.9}Ga_{0.1}As$ layers and reaches the GaAs substrate 701, as shown in FIG. 5A. The second way stops etching in the course of etching the DBR layer 803. As shown in FIG. 5A, when the GaAs substrate 801 as well as the DBR layer 803 are etched, the resultant post structure is too high to maintain the satisfactory accuracy in the post process. Particularly, there may be difficulty in production of a dense element array. With the above in mind, it is preferable that the height of the post structure is restricted so that etching is stopped in the course of etching the DBR layer 803.

Then, as shown in FIG. 6E, the VCSEL substrate on which the post structure 812 has been formed is oxidized in moisture vapor ambience at an anneal temperature of 350° C.–450° C. The AlAs layer 807 exposed to the sidewall of the post structure 812 is oxidized toward the center of the post structure 812 from the end thereof, so that an oxide region 813 dependent on the oxidizing time can be formed. The oxide region 813 is a porous insulating film, which serves as a current blocking layer for current confinement. A remaining AlAs region 814 that has not been oxidized (non-oxide region) defines a current path. The non-oxide region 814 has a refractive index different from that of the oxide region 813, and therefore acts as an aperture for controlling the horizontal mode of laser light.

Thereafter, as sown in FIG. 6F, the entire post structure is coated with a $SiN_x$, $SiO_2$ or $SiO_xN_y$ film by CVD, so that an interlayer insulating film 815 can be formed. This is intended to reinforce the post structure because the oxidized region of the AlAs layer 807 is a porous thin film and is structurally weakened. Japanese Unexamined Patent Publication No. 11-340565, the applicant of which is the same as the assignee of the present application, discloses the use of an AlAs control layer (current confinement layer) that has an Al composition of 100%. The above publication proposes to reinforce the mesa structure by coating it with an interlayer insulating film in order to solve a problem such that the mesa structure after the oxidization process may be removed due to a post process of rapid annealing. Next, an electrode material is deposited, and is then annealed at about 400° C. in order to make the electrode ohmic.

However, the interlayer insulating film 815 may be released from the coated surface on the bottom of the mesa structure in annealing at about 400° C. for making the electrode ohmic. In some VCSEL substrates, the interlayer insulating film 815 may float above the coated surface or may be totally separated from the mesa structure. If the degree of separation is too bad, the interlayer insulating film 815 may go into pieces and may be scattered. The above reduces the number of normal VCSEL elements and degrades the reliability thereof. As a result, the yield of VCSEL elements may be degraded to tens to 50%.

SUMMARY OF THE INVENTION

The present invention has been made in view of the above circumstances and provides a surface emitting semiconductor laser and a process for producing the same.

More specifically, the present invention provides a surface emitting semiconductor laser having an improved structure that results in an improved yield.

According to an aspect of the present invention, a surface emitting semiconductor laser has: a substrate; a first semiconductor multilayer reflector formed on the substrate; an active region formed on the first semiconductor multilayer reflector; a second semiconductor multilayer reflector formed on the active region; a current confinement layer interposed between the first and second semiconductor multilayer reflectors and partially including an oxide region; and an insulating layer formed on a coated surface provided by a first semiconductor layer which is part of the first semiconductor multilayer reflector and is revealed after removal of a surface oxidation layer.

According to another aspect of the present invention, a surface emitting semiconductor laser has: a substrate; semiconductor layers laminated on the substrate in turn, the semiconductor layers includes a first reflector having a first electrical conduction type, an active region on the first reflector, at least one current confinement partially including an oxide region, and a second electrical conduction type; a mesa at least extending from the second reflector to the current confinement region; and an insulating film that covers at least a bottom and a sidewall of the mesa, the bottom of the mesa covered by the insulating film being in the absence of an oxide region.

According to yet another aspect of the present invention, a surface emitting semiconductor laser has: a substrate; a first semiconductor multilayer reflector formed on the substrate; an active region formed on the first semiconductor multilayer reflector; a pair of spacer layers that sandwich the active layer; a second semiconductor multilayer reflector formed on the active region; a current confinement layer interposed between the first and second semiconductor multilayer reflectors and partially including an oxide region, a mesa structure ranging at least from the second reflector to the current confinement layer being defined; and an insulating layer that covers at least a sidewall and a bottom of the mesa structure, the bottom of the mesa structure being provided by a first one of the pair of spacer layers that is in the absence of an oxide layer.

According to another aspect of the present invention, a process of producing a surface emitting semiconductor laser has the steps of: (a) forming, on a substrate, a first semiconductor multilayer reflector of a first electrically conducting type, an active region, at least one semiconductor layer that confines current, and a second semiconductor multilayer reflector of a second electrically conducting type; (b) forming, by etching, a mesa structure that includes at least the second semiconductor multilayer reflector and the at least one semiconductor layer; (c) partially oxidizing an exposed sidewall of the at least one semiconductor layer to thereby form a current confinement region; (d) removing, by etching, an oxide layer formed on a bottom of the mesa structure exposed by the step (b); and (e) forming an insulating film that covers the bottom and sidewall of the mesa structure.

BRIEF DESCRIPTION OF THE DRAWINGS

Other objects, features and advantages of the present invention will become more apparent when read in conjunction with the accompanying drawings, in which.

DESCRIPTION OF THE PREFERRED EMBODIMENTS

Figure 5A:
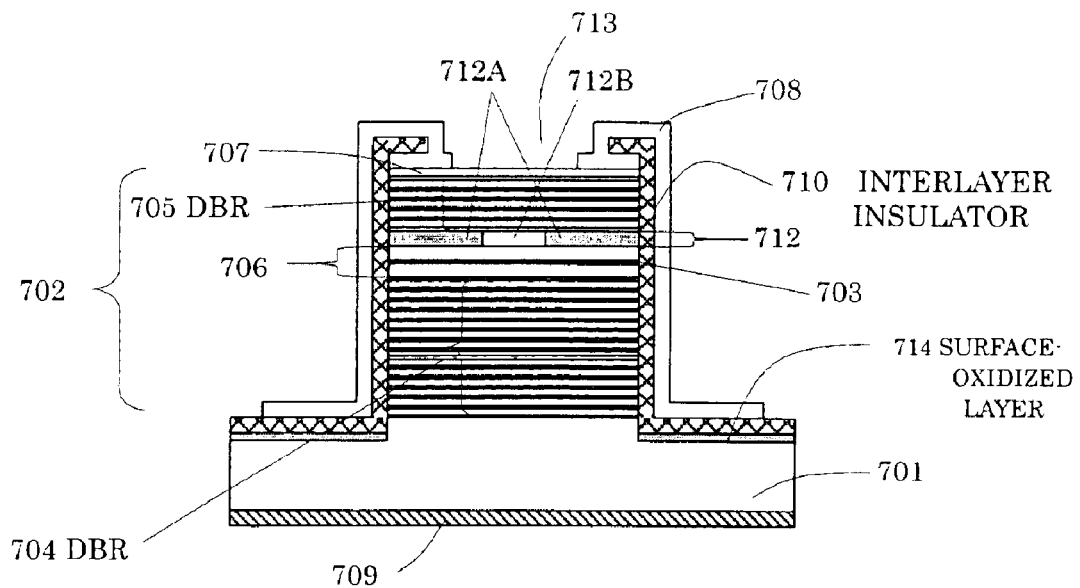
FIG. 5A is a cross-sectional view of a conventional oxide-confined VCSEL having a relatively high post.
Figure 5B:
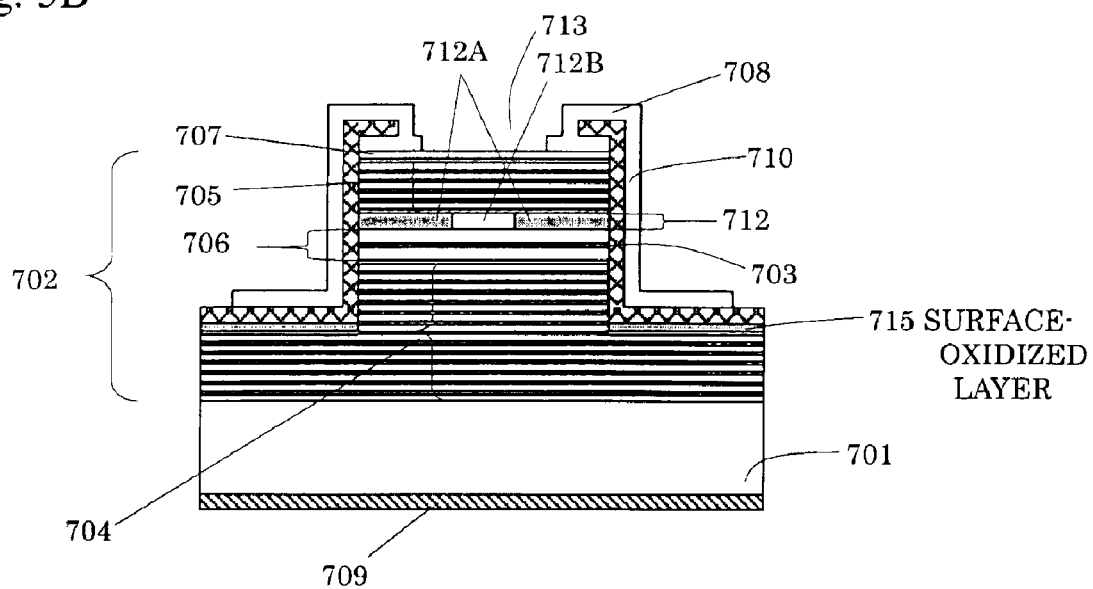
FIG. 5B is a cross-sectional view of another conventional oxide-confined VCSEL having a relatively low post.
Figure 6A:
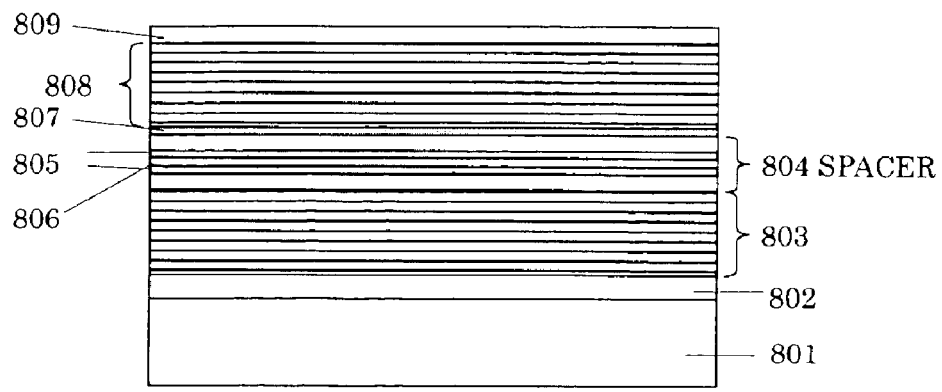
FIGS. 6A through 6F are respectively cross-sectional views of a process of producing the conventional oxide-confined VCSEL shown in FIG. 5B.
Figure 6B:
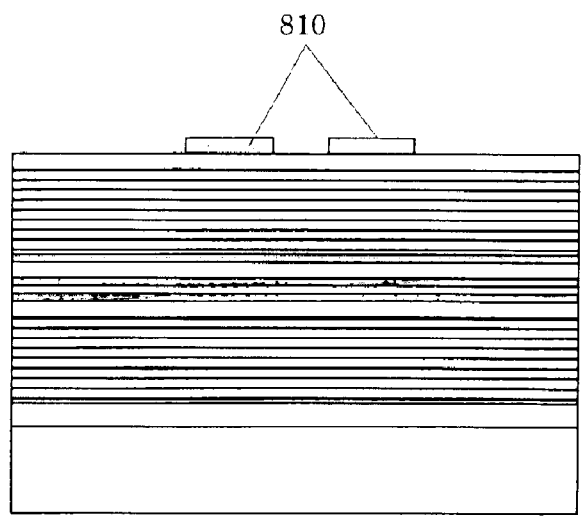
Figure 6C:
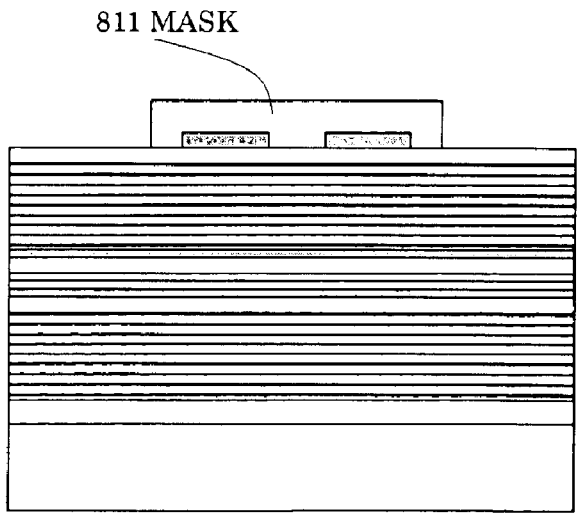
Figure 6D:
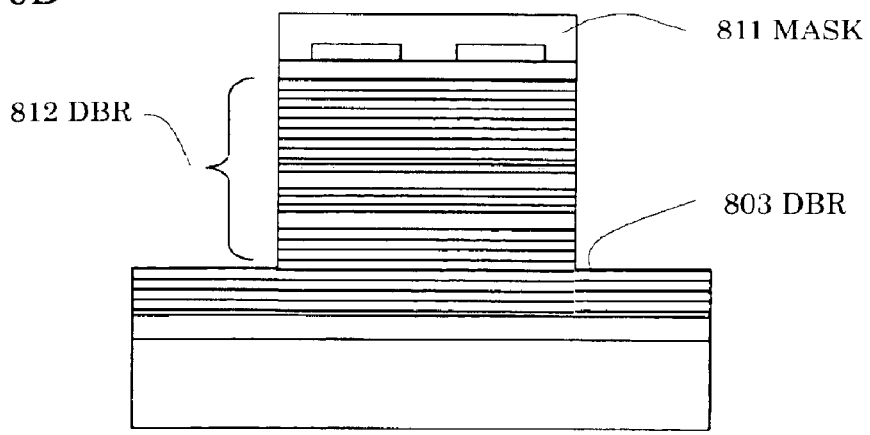
Figure 6E:
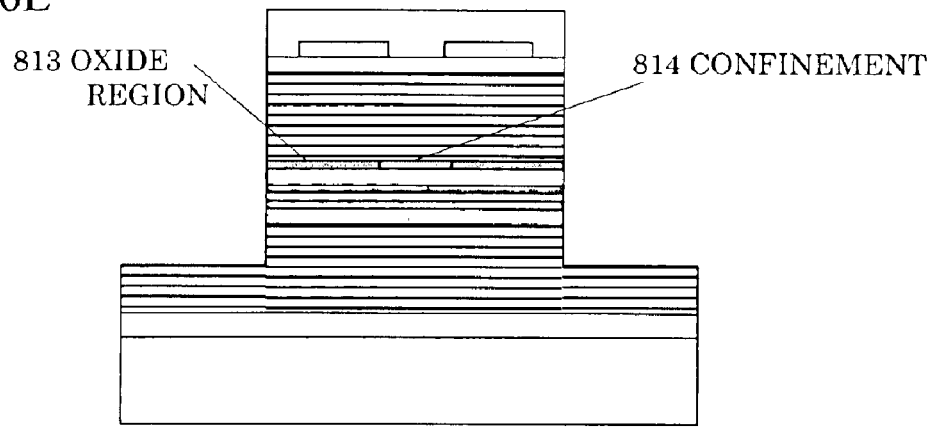
Figure 6F:
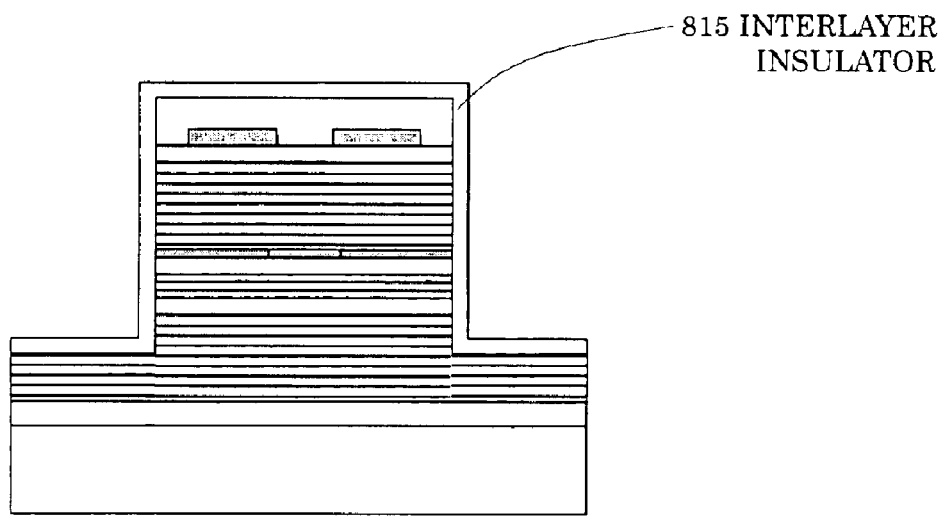

The present inventors conducted experiments directed to investigating the mechanism of causing the interlayer insulating layer 815 to be released from the mesa structure and found out factors. The surface of AlGaAs layer at the mesa bottom that is coated with the interlayer insulating film 815 is denaturalized into an AlGaAs oxide film by the process of oxidizing the AlAs layer 807. In the denaturalized AlGaAs oxide layer, most covalent bindings of Al—As or Ga—As are cut due to oxidization, and the AlGaAs oxide layer is therefore formed by a compound of clusters of GaAs, AlAs, Al oxide, Ga oxide and As oxide. The individual clusters are weakly bound due to covalent bindings of Al—As or Ga—As. Thus, the AlGaAs surface layer that has been exposed by dry etching has been changed into a structurally weak material due to the oxidization process. The interlayer insulating film 815 with which the AlGaAs oxide layer is directly coated has a weak adhesiveness to the underlying layer and is easily released in the coating interface due to thermal stress applied in the post process. Further, the degree of releasing depends on the composition of Al in the AlGaAs layer. More particularly, the higher the Al composition, the worse the degree of releasing. This is because Al—As bindings are more easily replaced with oxide than Ga—As bindings and the structurally weak oxide region increases as the Al composition increases. The element shown in FIG. 5A in which the mesa bottom is the GaAs oxide layer exhibits a degree of releasing of the interlayer insulating film that is quite different from that of the element shown in FIG. 5B in which the mesa bottom is the AlGaAs oxide layer. More particularly, the degree of releasing observed in the element shown in FIG. 5B is greater than that in the element shown in FIG. 5A.

Based on the experimental results, according to an embodiment of the present invention, a surface emitting semiconductor laser includes a substrate; a first semiconductor multilayer reflector of a first electrical conduction type formed on the substrate, an active region formed on the first semiconductor multilayer reflector, a second semiconductor multilayer reflector of a second electrical conduction type formed on the active layer, and a current confinement layer that is interposed between the first and second semiconductor multilayer reflectors and includes an oxide region in a semiconductor layer. At least one semiconductor layer that is part of the first semiconductor multilayer reflector is exposed as a coated surface. An oxide layer is removed from the surface of the coated layer, and an insulating layer is formed thereon.

The surface emitting semiconductor laser is of oxide-confined type, and preferably has a mesa or post structure. The mesa structure may be the post structure as shown in FIG. 5A or 5B. The substrate may be a semiconductor substrate or an insulating substrate. For example, the substrate is made of GaAs or InP. When the insulating substrate is used, it is preferable to form a contact layer that is formed on the insulating substrate and is electrically connectable to the first semiconductor multilayer reflector rather than a contact layer formed on the bottom of the substrate. Particularly, when the mesas or laser elements are arranged in a matrix formation, a contact layer having a pattern selective to the first semiconductor multilayer reflector of each mesa is preferably formed on the substrate. The current confinement layer may be located above or below the active layer, and includes at least one layer made of, for example, AlAs or AlGaAs. When AlGaAs is used, it is desirable to employ a relatively high composition of Al in order to enable selective oxidization in which the oxidizing rate of AlGaAs is different from the oxidizing rates of other semiconductor layers. Laser may be emitted from the substrate side or the mesa side. The reflectance values of the first and second semiconductor multilayer reflectors may be appropriately selected based on from which side laser is emitted. When laser is emitted from the mesa side, the second semiconductor multilayer reflector has a reflectance lower than that of the first semiconductor multilayer reflector. For instance, the number of semiconductor layers laminated may be changed for the DBR film. The insulating film that contacts the coated surface defined by the bottom of the mesa structure and covers the sidewall of the mesa structure may be $SiN_x$, $SiO_2$, or $SiO_xN_y$.

The first semiconductor multilayer reflector is a distributed Bragg reflector film (DBR film) in which two semiconductor layers having different Al compositions are alternately laminated, and may be $Al_xGa_{1-x}As$. It is desirable that the layer exposed as the coated surface contains a relatively low Al composition. This is because the oxide region, which is structurally weak, expands further as the Al composition increases, and the oxide layer may be removed easily as the Al composition is low. In order to define the coated surface for the insulating film by using the $Al_xGa_{1-x}As$ layer having x equal to or smaller than 0.5, the oxidized surface portion or layer out of the AlGaAs layer provided on the bottom of the mesa structure at the time of oxidizing part of the current confinement layer that is a semiconductor layer having a high Al composition is removed by dry etching, so that the semiconductor layer that has the Al composition equal to or smaller than 50% and is kept close under the AlGaAs oxidized surface layer appears as the surface layer of the mesa bottom.

As the surface layer that is exposed on the mesa bottom after removal of the AlGaAs oxidized surface layer by dry etching, the spacer layer that is an $Al_xGa_{1-x}As$ semiconductor layer having x equal to or smaller than 0.5 (low Al-composition semiconductor layer) may be used. Alternatively, an $Al_xGa_{1-x}As$ semiconductor layer that is one of the layers forming the DBR type semiconductor multilayer reflector having the first electrical conduction type and has an Al composition x equal to or smaller than 0.5 (low Al-composition semiconductor layer) may be used. However, the low Al-composition semiconductor layer that has an Al composition equal to or smaller than 0.5 in the semiconductor multilayer reflector of the DBR type is as thin as about 100 nm. It is therefore difficult to stop etching in the course of etching the low Al-composition semiconductor layer. Further, in case where there is a distribution in the etching depth, some layers form the surface layer of the mesa bottom, and the low Al-composition layer may not be evenly formed over the entire substrate surface. With the above in mind, at least one of low Al-composition semiconductor layers having an Al composition x equal to or smaller than 0.5 among the layers that define the DBR type semiconductor multilayer reflector of the first electrical conduction type is made thicker than the adjacent layers. With the above arrangement, it becomes possible to stop etching in the course of etching the low Al-composition semiconductor layer having the Al composition x equal to or lower than 0.5.

In case where the low Al-composition semiconductor layer that is made thicker has an arbitrary thickness, the traveling wave and reflecting wave are not in phase, so that the reflectance of the semiconductor multilayer reflector of the DBR type is decreased and the laser characteristic is degraded. Taking into consideration the above, an optical thickness nd (the product of n and d) in the mesa region of the low Al-composition semiconductor layer having an Al composition equal to or smaller than 0.5 is set equal to an integral multiple of ¼ of the wavelength of laser oscillated where d is the thickness of the above low-composition semiconductor layer having an Al composition equal to or smaller than 0.5 in the mesa region, and n is the refractive index of the low Al-composition semiconductor layer. The above setting of the optical length contributes to avoiding drastic decrease in the reflectance of the semiconductor multilayer reflector of DBR type. When the value of the product nd is equal to an odd-number multiple of ¼ of the wavelength of laser oscillated, decrease in the reflectance can be suppressed more effectively.

A natural oxide film is formed on the surface of the low Al-composition semiconductor layer after removal of the AlGaAs oxidized surface layer on the mesa bottom when it is left in the air or is rinsed out by water. Even if the natural oxide film is coated with an insulating film of $SiN_x$, $SiO_2$ or SiON, good adhesiveness will not be obtained, and the insulating film may be released during the post process of annealing. Taking into account the above, the wafer is processed by a gas containing fluorine (F) or sulfur immediately after removal of the AlGaAs oxidized surface layer, preferably, without exposing the air. Thereby, residual chloride on the surface layer can be removed and a compound of Al and fluoride can be formed on the surface, so that a surface oxide film can be prevented from being formed when the wafer is exposed to the air after the process is finished. This enhances the adhesiveness at the interface between the coated surface and the insulating film of $SiN_x$ or the like, and prevents the insulating film from being released from the coated surface.

Preferably, the upper semiconductor multilayer reflector includes a layer that prevents over-etching in the subsequent etching. The layer that prevents over-etching contains GaInP, for example.

Although the above-mentioned embodiment of the present invention is the surface emitting semiconductor laser of the AlGaAs base, the present invention includes an AlGaN-base surface emitting semiconductor laser that uses a mixed crystal of Al and Ga and has the current confinement structure formed by oxidization. The AlGaN-base surface emitting semiconductor laser has a structure similar to that of the AlGaAs-base laser and may be produced by a method similar to that of producing the AlGaAs-base laser. The interlayer insulating layer in the AlGaN-base laser can be effectively suppressed from being separated. The present invention includes a surface emitting semiconductor laser that has an active layer having the multiquantum well structure, the active layer being interposed between spacer layers. The present invention includes a laser array in which laser elements, namely, mesas are arranged in matrix formation. A heat-resistant organic film made of, for example, polyimide may be used to bury steps between the mesas.

A description will now be given of examples of the present invention.

EXAMPLES

Example 1

Figure 1A:
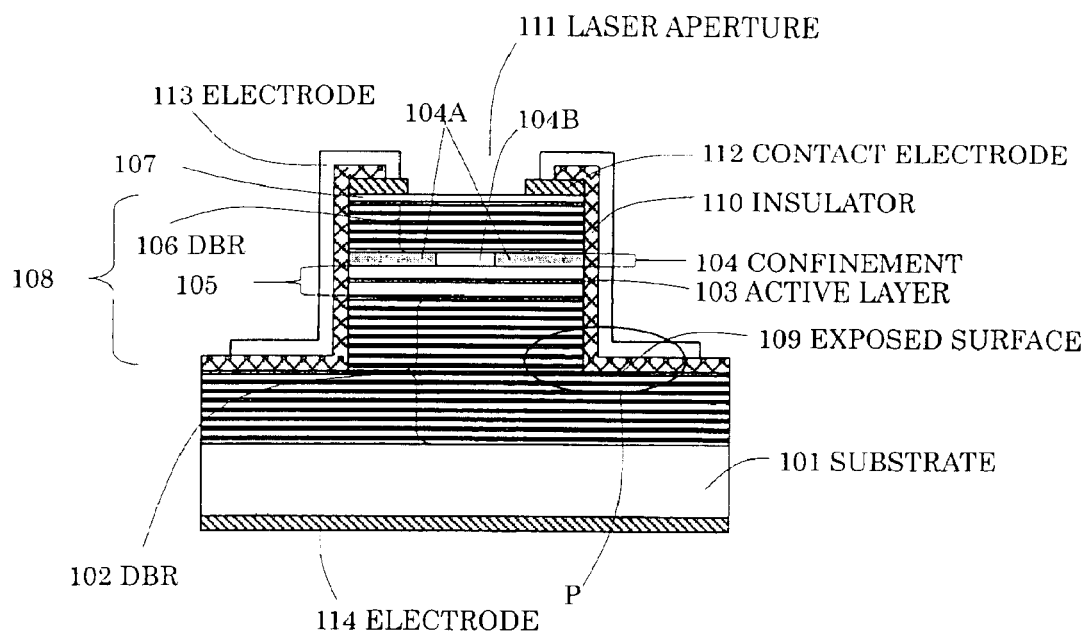
FIG. 1A is a cross-sectional view of a surface emitting semiconductor laser according to an embodiment of the present invention.
Figure 1B:
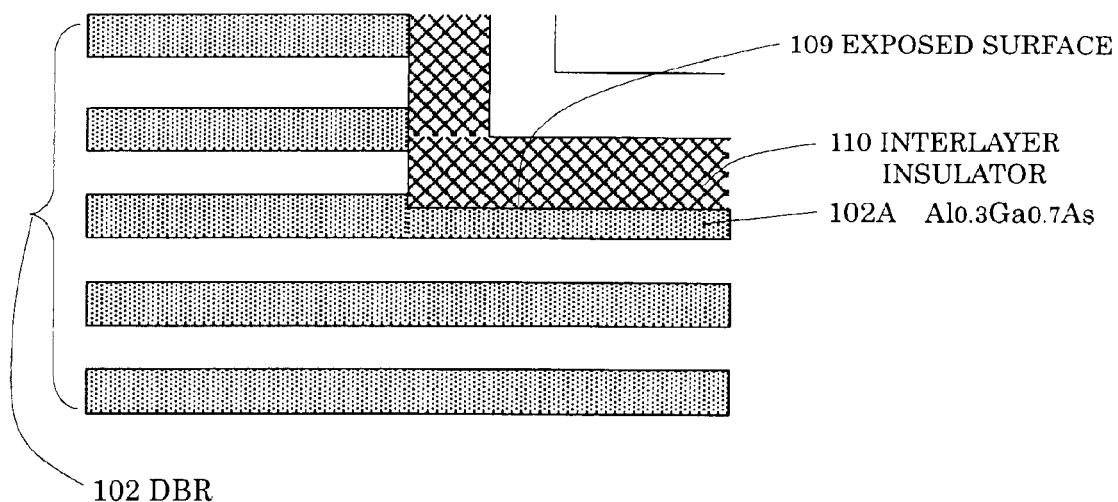
FIG. 1B is an enlarged view of a portion P of a post structure of the semiconductor laser shown in FIG. 1A.

FIG. 1A is a cross-sectional view of a surface emitting semiconductor laser according to Example 1 of the present invention, and FIG. 1B is an enlarged view of a bottom portion (P) that defines a post shown in FIG. 1A. The surface emitting semiconductor laser includes, on a Si-doped ($N_d=1\times10^{18}$ cm$^{-3}$) n-type GaAs semiconductor substrate 101, a distributed Bragg reflector 102, an undoped λ $Al_{0.6}Ga_{0.4}As$ spacer layer 105, an active layer 103 formed within the spacer layer 105, a Zn-doped ($N_a=7\times10^{17}$ cm$^{-3}$) p-type AlAs layer 104, a DBR layer 106 and a Zn-doped ($N_a=7\times$ $10^{19}$ cm$^{-3}$) p-type GaAs layer 107, which layers are laminated in this order. The DBR layer 102 is composed of a plurality of Si-doped ($N_d=1\times10^{18}$ cm$^{-3}$) n-type $Al_{0.3}Ga_{0.7}As/Al_{0.9}Ga_{0.1}As$ laminated by 40.5 cycles (40.5 pairs) The active layer 103 is composed of triplicate quantum wells of $Al_{0.11}Ga_{0.89}As/Al_{0.3}Ga_{0.7}As$. The DBR layer 106 is composed of a plurality of Zn-doped ($N_a=7\times10^{17}$ cm$^{-3}$) p-type $Al_{0.3}Ga_{0.7}As/Al_{0.9}Ga_{0.1}As$ laminated by 30.5 cycles.

The Zn-doped ($N_a=7\times10^{17}$ cm$^{-3}$) p-type AlAs layer 104 serves as a current confinement layer, and is composed of an oxide region 104A and a non-oxide region 104B. A most or mesa structure 108, which may be called mesa or post and is defined by etching, reaches approximately midway along the DBR layer 102 composed of Si-doped ($N_d=1\times10^{18}$ cm$^{-3}$) n-type $Al_{0.3}Ga_{0.7}As$ and $Al_{0.9}Ga_{0.1}As$ layers alternately laminated by 40.5 cycles. The oxidized surface of the $Al_{0.3}Ga_{0.7}As$ layer has been removed from an exposed surface 109, which is the bottom of the post structure 108 and is a coated surface that is to be coated with an interlayer insulating film 110, and does not remain. Rather, among the layers that form the DBR layer 102 composed of Si-doped ($N_d=1\times10^{18}$ cm$^{-3}$) n-type $Al_{0.3}Ga_{0.7}As$ and $Al_{0.9}Ga_{0.1}As$ layers alternately laminated, the rinsed surface of a Si-doped ($N_d=1\times10^{18}$ cm$^{-3}$) n-type $Al_{0.3}Ga_{0.7}As$ layer 102A, which has a relatively low Al composition, is exposed. The exposed surface of the layer 102A is directly coated with the $SiN_x$ interlayer insulating film 110. On the top portion of the post structure 108, there are provided a contact electrode 112 that defines a laser aperture 111, and an anode (p) side wiring electrode 113. An n-side electrode 114 is formed on the back surface of the Si-doped ($N_d=1\times10^{18}$ cm$^{-3}$) n-type GaAs semiconductor substrate 101.

Example 2

Figure 2A:
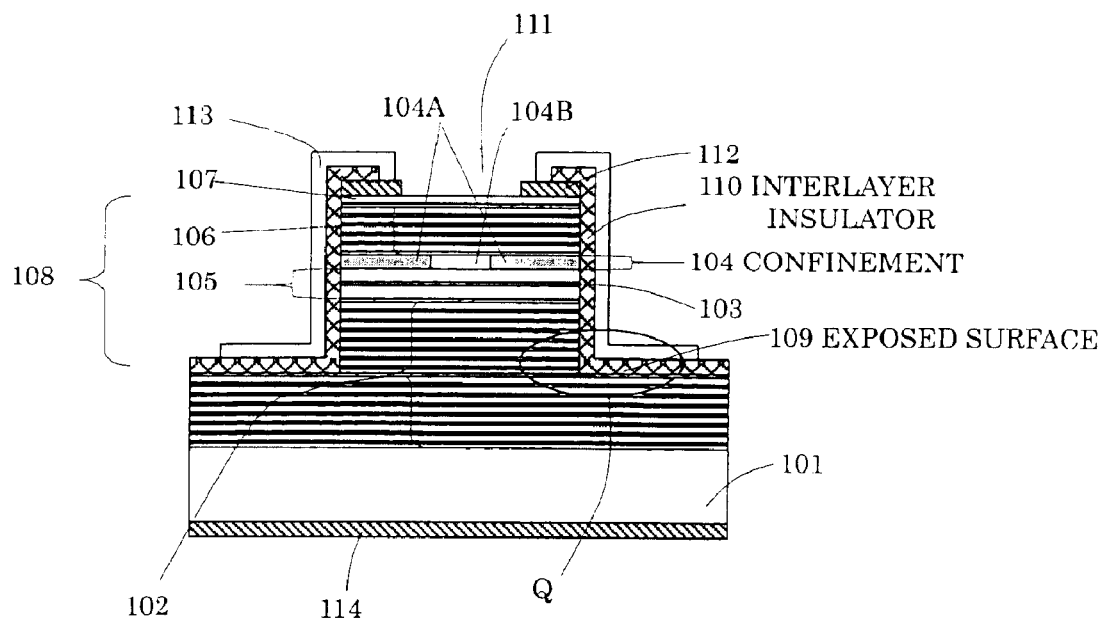
FIG. 2A is a cross-sectional view of a surface emitting semiconductor laser according to another embodiment of the present invention.
Figure 2B:
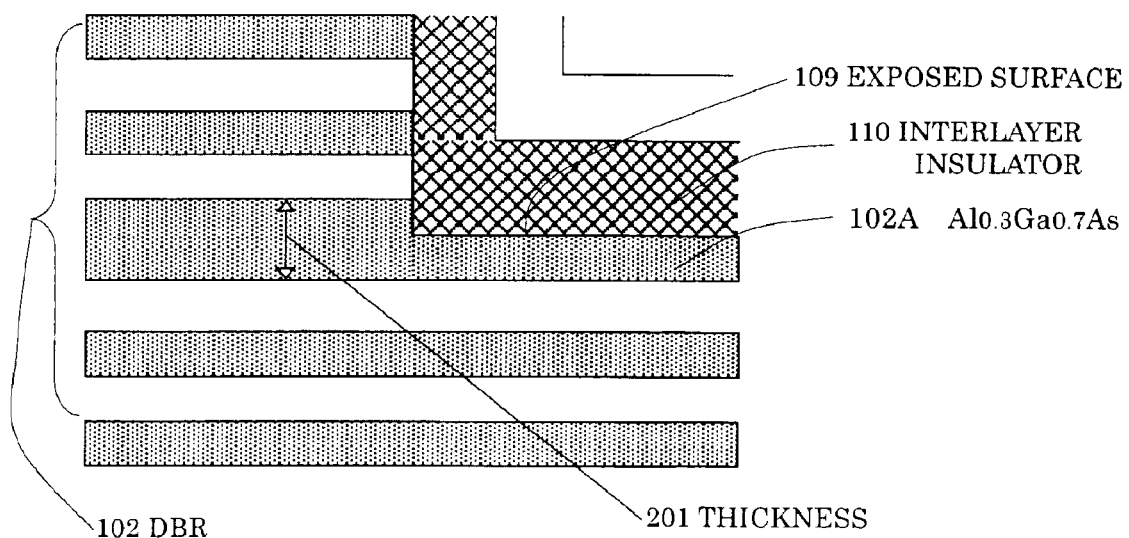
FIG. 2B is an enlarged view of a portion Q of a post structure of the semiconductor laser shown in FIG. 2A.

FIG. 2A is a cross-sectional view of a surface emitting semiconductor laser according to Example 2, and FIG. 2B is an enlarged view of a bottom portion (Q) that defines the post. Example 2 differs from Example 1 in that the Si-doped ($N_d=1\times10^{18}$ cm$^{-3}$) n-type $Al_{0.3}Ga_{0.7}As$ layer 102A that has a relatively low Al composition out of the layers forming the DBR layer 102 composed of Si-doped ($N_d=1\times10^{18}$ cm$^{-3}$) n-type $Al_{0.3}Ga_{0.7}As$ and $Al_{0.9}Ga_{0.1}As$ layers alternately laminated by 40.5 cycles and that appears on the bottom portion of the post structure 108 has a thickness 201 equal to an integral multiple of the length equal to ¼ of the wavelength λ of laser oscillation. By intentionally thickening the layer 102A, the surface layer on the mesa bottom can be formed by the Si-doped ($N_d=1\times10^{18}$ cm$^{-3}$) n-type $Al_{0.3}Ga_{0.7}As$ layer 102A that has a relatively low Al composition over the entire wafer, even if etching is performed at different rates. Simultaneously, it is possible to avoid drastic decrease in the reflectance of the semiconductor multilayer reflector and produce devices having excellent laser performance. The above effects are further enhanced by setting the thickness 201 equal to an odd-number multiple of the length equal to ¼ of the wavelength λ of laser oscillation.

Example 3

Figure 3:
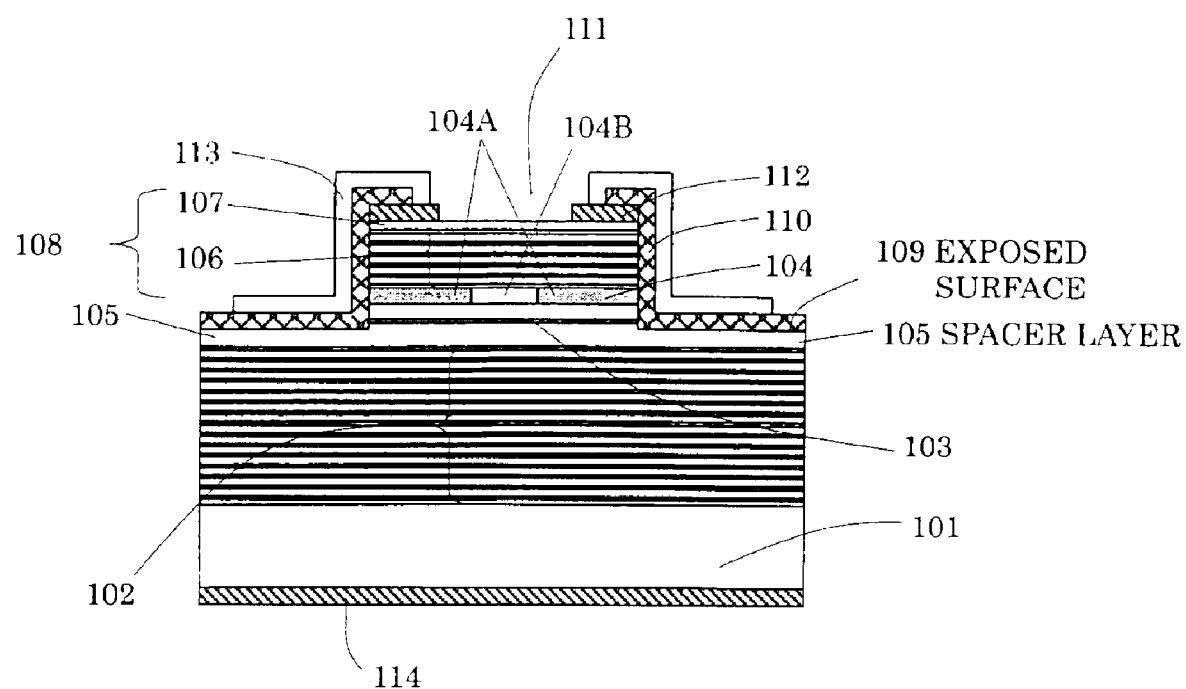
FIG. 3 is a cross-sectional view of a surface emitting semiconductor laser of yet another embodiment of the present invention.

FIG. 3 is a cross-sectional view of a surface emitting semiconductor laser according to Example 3. Example 3 differs from Examples 1 and 2 in that the exposed surface 109 that is the bottom portion of the post structure defined by dry etching is the undoped λ $Al_{0.6}Ga_{0.4}As$ spacer layer 105 that has a low Al composition equal to or lower than 50%. According to Example 3, the post can be made lower than that in Examples 1 and 2, so that the structural strength can be further improved.

A description will now be given, with reference to FIGS. 4A through 4I, of a process for producing the AlAs oxide type VCSEL according to an embodiment of the present invention.

1) Growth of VCSEL Thin-Film Substrate

Figure 4A:
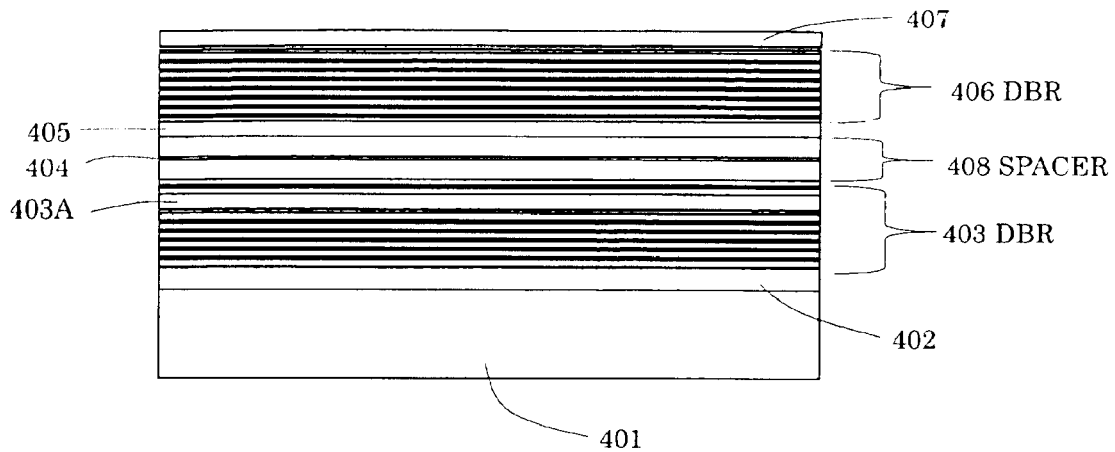
FIGS. 4A through 4I are respectively cross-sectional views of a process of producing a surface emitting semiconductor laser according to an embodiment of the present invention.

First, as shown in FIG. 4A, III–V compound semiconductor layers (GaAs, AlGaAs) are sequentially grown epitaxially on a bulk crystal of a III–V compound semiconductor such as GaAs by MOVPE (Metal Organic Vapor Phase Epitaxy), and are thus laminated. As has been described previously, the laminated layer structure includes at least the active layer, the spacer layer, semiconductor multilayer mirrors of DBR type, and contact layers. More particularly, the surface emitting semiconductor laser includes, on a Si-doped ($N_d=1\times10^{18}$ cm$^{-3}$) n-type GaAs semiconductor substrate 401, a Si-doped ($N_d=1\times10^{18}$ cm$^{-3}$) n-type GaAs buffer layer 402, a distributed Bragg reflector 403, an undoped $\lambda$ Al$_{0.6}$Ga$_{0.4}$As spacer layer 408 (or undoped $\lambda$ Al$_{0.4}$Ga$_{0.6}$As spacer layer 408), an active layer 404, a Zn-doped ($N_a=7\times10^{17}$ cm$^{-3}$) p-type AlAs layer 405, a DBR layer 406 and a Zn-doped ($N_a=7\times10^{19}$ cm$^{-3}$) p-type GaAs layer 407, which layers are laminated in this order. The DBR layer 403 is composed of Si-doped ($N_d=1\times10^{18}$ cm$^{-3}$) n-type Al$_{0.3}$Ga$_{0.7}$As/Al$_{0.9}$Ga$_{0.1}$As layers laminated by 40.5 cycles. The active layer 404 is composed of triplicate quantum wells of Al$_{0.11}$Ga$_{0.89}$As/Al$_{0.3}$Ga$_{0.7}$As. The DBR layer 406 is composed of Zn-doped ($N_a=7\times10^{17}$ cm$^{-3}$) p-type Al$_{0.3}$Ga$_{0.7}$As/Al$_{0.9}$Ga$_{0.1}$As layers laminated by 30.5 cycles. A band barrier buffer layer having a composition between Al$_{0.3}$Ga$_{0.7}$As and Al$_{0.9}$Ga$_{0.1}$As may be provided at each interface of the p-type Al$_{0.3}$Ga$_{0.7}$As/Al$_{0.9}$Ga$_{0.1}$As DBR layer in order to reduce the series resistance of the device. At this stage, the thickness A of the specific n-type Al$_{0.3}$Ga$_{0.7}$As out of the Si-doped ($N_d=1\times10^{18}$ cm$^{-3}$) n-type Al$_{0.3}$Ga$_{0.7}$As/Al$_{0.9}$Ga$_{0.1}$As layers laminated by 40.5 cycles is made thicker than the adjacent n-type Al$_{0.3}$Ga$_{0.7}$As layers. At this time, the thickness of the specific n-type Al$_{0.3}$Ga$_{0.7}$As is set equal to an integral multiple of the length equal to ¼ of the wavelength of laser oscillation. Particularly, when the thickness of the specific n-type Al$_{0.3}$Ga$_{0.7}$As is set equal to an odd-number multiple of the length equal to ¼ of the wavelength of laser oscillation, the surface emitting semiconductor laser has further improved laser characteristics.

2) Forming P-Side Contact Electrode Having Aperture

Figure 4B:
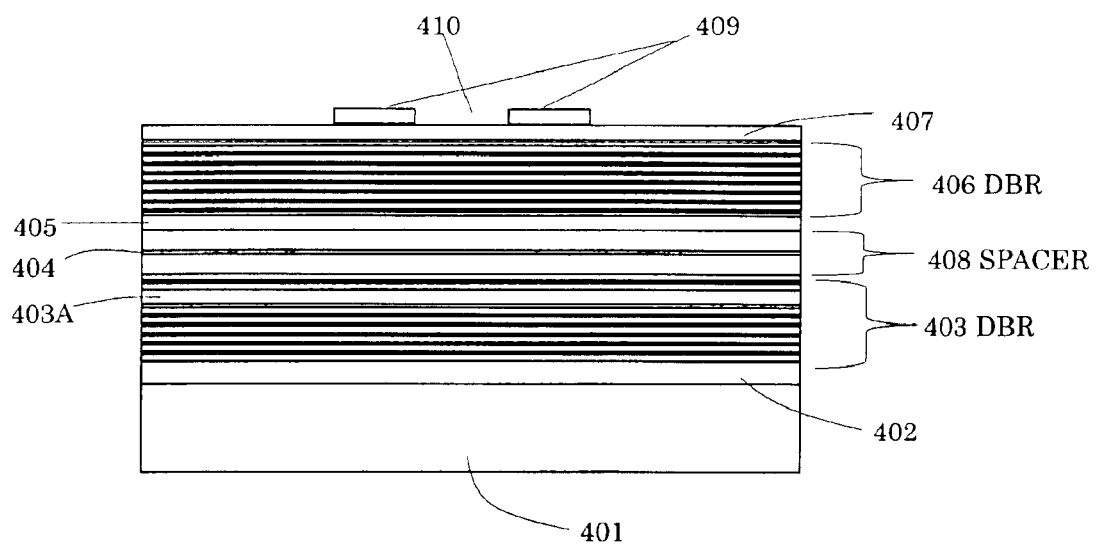

Next, as shown in FIG. 4B, a p-side contact electrode 409 having an aperture 410, via which laser is emitted, is formed on the uppermost surface of the VCSEL substrate formed by the MOVPE apparatus. Preferably, the contact electrode 409 is formed by applying a resist pattern on the substrate surface by photolithography, depositing Ti and Au in turn, and removing the resist pattern and unnecessary metal by liftoff. Alternatively, Ti and Au are provided in turn beforehand, and a resist pattern is formed on the Au layer by ordinary photolithography. Then, the Ti and Au layers are patterned by etching. The p contact electrode 409 may be made of AuZn/Au, Ti/Pt/Au.

3) Forming N-Side Electrode on Back Side

Figure 4C:
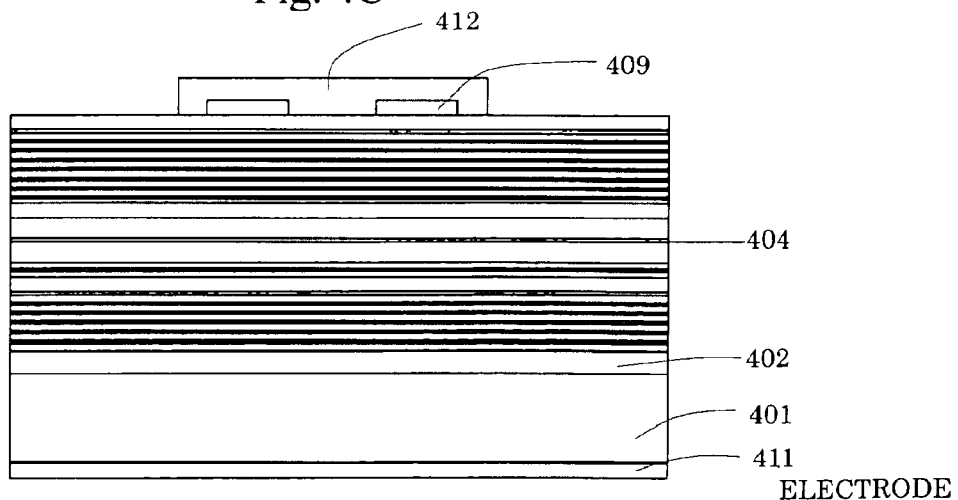

Then, as shown in FIG. 4C, an n-side electrode 411 is formed on the back side of the GaAs substrate that is opposite to the front side on which the contact electrode 409 is formed. The n-side electrode 411 may be made of AuGe/Au, AuGe/Ni/Au. Then, the VCSEL substrate is annealed in the nitrogen atmosphere at 350° C. to 400° C. in order to change the electrodes 409 and 411 to low-resistance ohmic electrodes.

4) Forming Mask for Post Etching

An etching mask 412 is formed to form the post (mesa) structure. The etching mask 412 is formed by depositing an insulating film made of, for example, SiO$_2$, SiON or SiN$_x$ on the entire surface from the top side of the p-side contact electrode 409. The insulating film may be patterned by ordinary photolithography that includes the steps of applying resist, exposing the resist for patterning, and developing the patterned resist. Then, the resist is etched by buffered hydrofluoric acid or the like, so that an etching mask pattern for the insulating film can be formed. The mask may be etched by dry etching.

5) Forming Post (Mesa) Structure

Figure 4D:
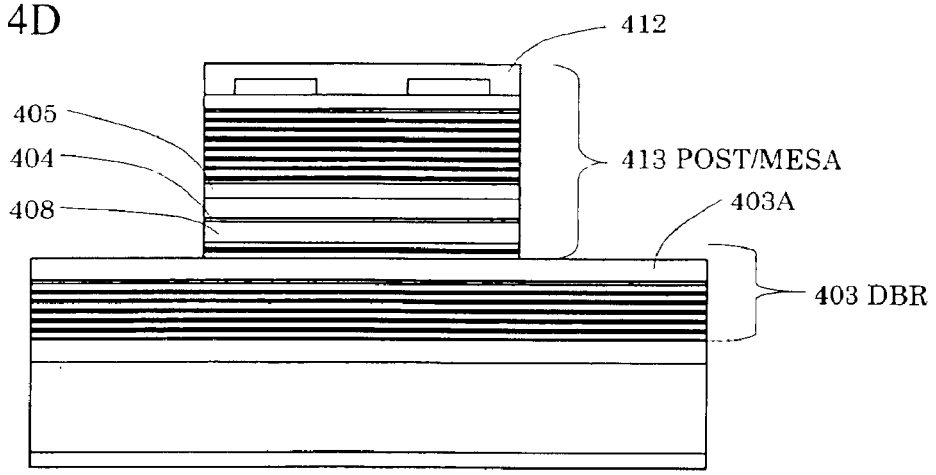

Then, as shown in FIG. 4D, the wafer is dry-etched to a depth of a few microns to ten and a few microns except the portion covered by the mask 412 by the dry etching apparatus using a chlorine-based gas. This etching results in a post 413. An attention to the depth of etching should be drawn. More particularly, the depth of etching should consider the step shown in FIG. 4F, in which the oxidized surface of the AlGaAs layer on the bottom portion of the post structure is removed. The depth of etching in FIG. 4D should be adjusted so that the surface layer on the bottom of the post structure after the oxidized surface of the AlGaAs is removed is an n-type AlGaAs having a low Al composition equal to or smaller than 50%. In Examples 1 and 2 mentioned before, the surface layer on the bottom of the post structure is the n-type Al$_{0.3}$Ga$_{0.7}$As that is the low Al-composition layer among the layers of the DBR layer made up of Si-doped ($N_d=1\times10^{18}$ cm$^{-3}$) n-type Al$_{0.3}$Ga$_{0.7}$As/Al$_{0.9}$Ga$_{0.1}$As layers laminated by 40.5 cycles. Therefore, the wafer is etched up to the depth of a DBR layer 403A made up of Si-doped ($N_d=1\times10^{18}$ cm$^{-3}$) n-type Al$_{0.3}$Ga$_{0.7}$As/Al$_{0.9}$Ga$_{0.1}$As layers laminated by 40.5 cycles or up to the layer just before the layer 403A, or is etched short of the layer 403A. In Example 3, the spacer layer is the bottom of the post structure. Therefore, the wafer is etched up to the depth of the undoped $\lambda$ Al$_{0.4}$Ga$_{0.6}$As spacer layer 408. At that time, it is required that an end portion of the AlAs layer 405 is exposed on the side of the post 413 so that the AlAs layer 405 can be oxidized.

6) Oxidizing AlAs Layer

Figure 4E:
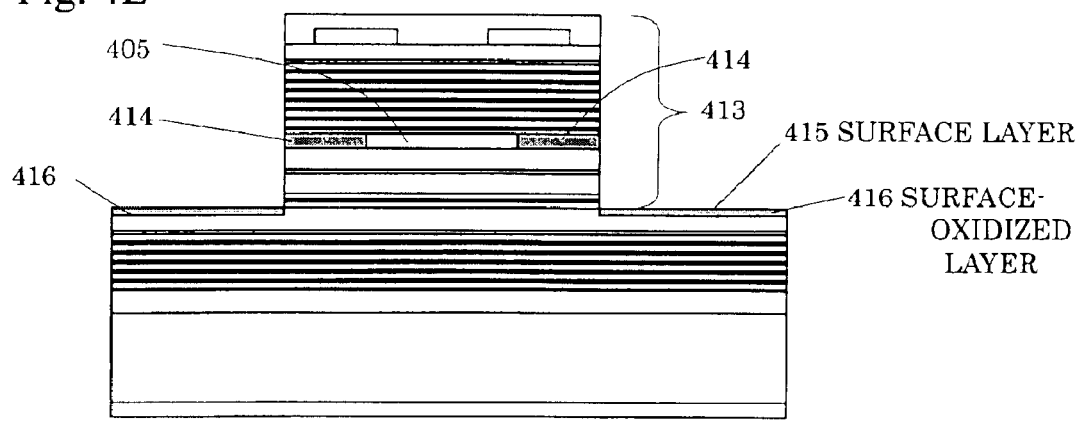

Following the step of defining the post 413, the wafer is immediately inserted into an anneal oven and an AlAs layer 414 is selectively oxidized from the side of the post 413 by introducing moisture vapor, as shown in FIG. 4E. The anneal temperature ranges from 340° C. to 400° C. Hot water at a temperature of 70° C. to 100° C. is processed to bubble in a hot water tank by introducing a nitrogen carrier gas therein, and the resultant moisture vapor is then transported to the anneal oven. Moisture vapor oxidization changes the AlGaAs and AlAs layers that have relatively high Al compositions to aluminum oxide (Al$_x$O$_y$). In the above oxidization, AlAs is oxidized at an oxidizing rate much higher than that of AlGaAs. Therefore, only AlAs is selectively oxidized toward the center of the post 413 from the end portion exposed on the side of the post 413 so that an Al$_x$O$_y$ layer 414 due to oxidization of the AlAs layer can be formed. By controlling the annealing time, only a desired size of the AlAs layer 405 can be left in the center of the post 413. The Al$_x$O$_y$ layer 414 has an extremely small electric conductivity whereas the AlAs layer 405 has an extremely large electric conductivity. Thus, the current confinement structure can be defined in which current flows in only the AlAs layer 405 left in the center of the post structure. At the same time as the AlAs layer 414 is oxidized, an AlGaAs surface-oxidized layer 416 is formed on the surface layer or exposed surface on the bottom of the post structure.

7) Removing AlGaAs Oxidation Surface Layer and Etching

Figure 4F:
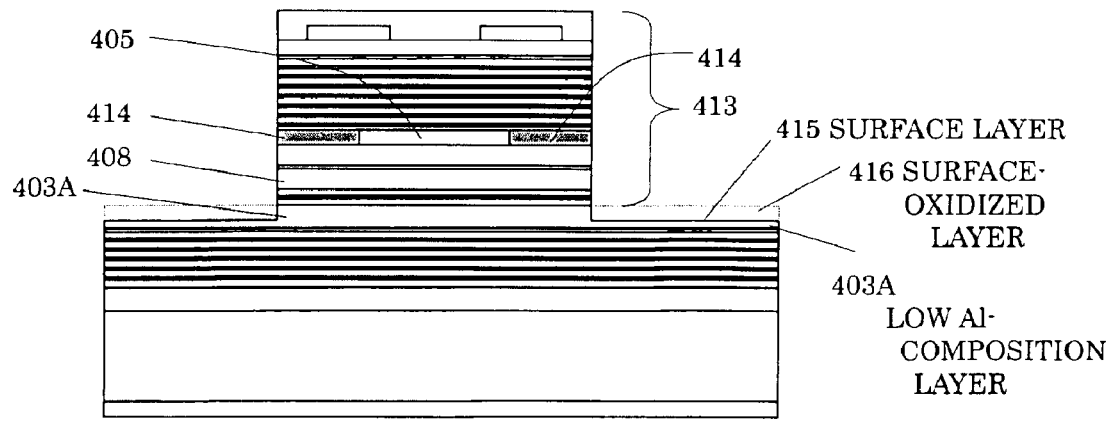

As shown in FIG. 4F, the AlGaAs surface-oxidized layer 416 on the bottom of the post structure formed during the process of oxidizing the AlAs layer is removed, and the wafer is etched so that a layer having an Al composition equal to or smaller than 50% defines the surface of the bottom of the post structure. Etching may use an etchant for wet etching such as hydrochloric acid, sulfuric acid or buffered hydrofluoric acid. However, wet etching may etch $Al_xO_y$ layer 414 for forming the current confinement structure. Thus, it is preferable to employ dry etching. Preferably, the etchant gas used in dry etching may be a chlorine-based gas such as $BCl_3$, $Cl_2$ or $SiCl_4$. The depth of etching is controlled so that the AlGaAs layer having an Al composition equal to or smaller than 50% is a surface layer 415 that defines the bottom of the post structure. The depth of etching can be controlled by knowing the etching rate in advance. The Examples 1 to 3 have mutually different layers at which etching is stopped. More particularly, the etching stop layer of Example 1 is the layer 403 of n-type $Al_{0.3}Ga_{0.7}As$ that has a low Al composition and is one of the layers that form the DBR layer 403 composed of Si-doped ($N_d = 1 \times 10^{18}$ cm$^{-3}$) n-type $Al_{0.3}Ga_{0.7}As/Al_{0.9}Ga_{0.1}As$ layers laminated by 40.5 cycles. The etching stop layer of Example 2 is n-type $Al_{0.3}Ga_{0.7}As$ forming the low Al-composition layer 403A that is one of the layers forming the DBR layer 403 and has the thickness equal to an integral multiple of ¼ of the wavelength λ of laser oscillation or equal to an odd-number multiple thereof. In Example 3, the undoped λ $Al_{0.4}Ga_{0.6}As$ spacer layer 408 is the etching stop layer.

8) Process with Fluorine Gas or SF6 Gas

Even by removing the AlGaAs oxidized surface layer on the bottom of the post structure by etching, a natural oxidation film may be formed on the AlGaAs surface exposed on the bottom of the post structure if the wafer is exposed to the air, and may degrade the adhesiveness to the interlayer insulating film. In order to avoid the above problem, the wafer is continuously dry-etched by an $SF_6$ gas without exposing the wafer to the atmosphere after removal of the AlGaAs oxidized surface layer. This results in a protection film in which the AlGaAs surface is replaced with fluorine or sulfur. The protection film suppresses formation of the natural oxidation film.

9) Covering by Interlayer Insulating Film

Figure 4G:
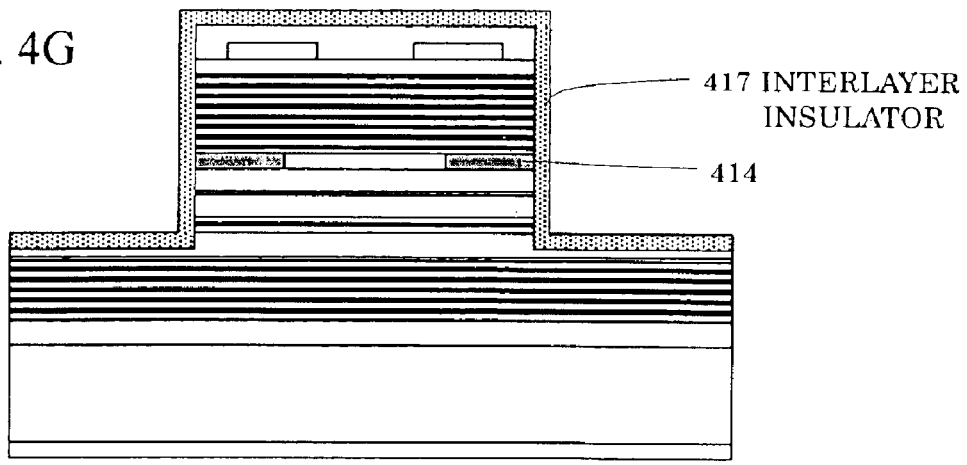

Then, as shown in FIG. 4G, the entire post structure is covered by an interlayer insulating film 417 made of, for example, $SiO_2$, SiON or $SiN_x$. The interlayer insulating film 417 acts to compensate for degradation of the strength of the post due to replacement of the most AlAs layer 414 with the porous $Al_xO_y$ film. The interlayer insulating film 417 also acts to prevent the property of the oxide film from being changed because the oxide film is exposed on the sidewall of the post.

10) Forming Contact Hole

Figure 4H:
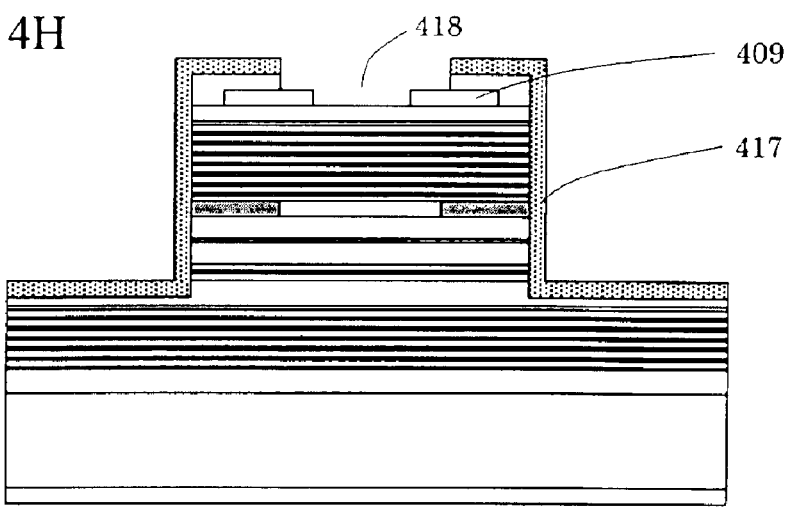

Then, as shown in FIG. 4H, a contact hole 418 is formed which is used to make a ground connection of a p-side wiring electrode to the p-side contact electrode 409 that underlies the interlayer insulating film 417 on the top of the post. The contact hole 418 may be lithographically defined by patterning and wet etching with buffered hydrofluoric acid or dry etching. Preferably, the contact electrode covers the entire bottom of the contact hole because the metal of an electrode formed by the subsequent process acts to avoid process damages to the underlying contact layer.

11) Forming P-Side Wiring Electrode

Figure 4I:
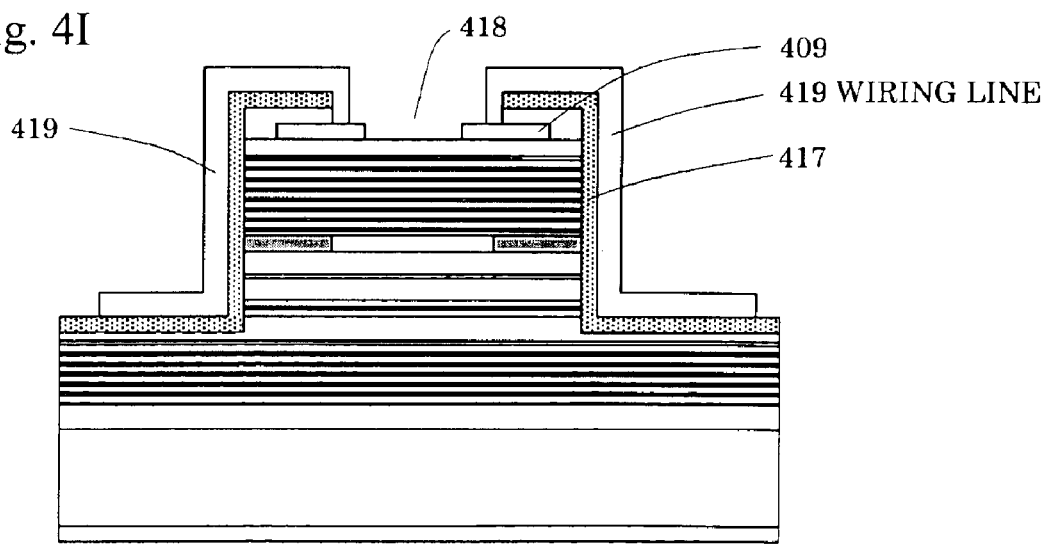

As shown in FIG. 4I, a p-side wiring electrode 419 is formed by, preferably, applying a resist pattern by ordinary photolithography, depositing Ti and Au in turn and removing the resist by liftoff. Alternatively, Ti and Au are provided in turn beforehand, and a resist pattern is formed on the Au layer by ordinary photolithography. Then, the Ti and Au layers are patterned by etching. The p-side contact electrode 409 may be made of AuZn/Au or Ti/Pt/Au other than Ti and Au.

12) Annealing

Finally, the wafer is annealed at about 400° C. in order to make the electrode ohmic. At that time, the interlayer insulating film 417 of $SiO_2$, SiON, $SiN_x$ or the like that covers the entire post structure can be prevented from being released due to the unique structure and process of the present invention.

As described above, according to one aspect of the present invention, the AlGaAs oxidized surface layer on the bottom of the post (mesa) structure formed in the oxidation process for making the current confinement layer of the oxide-confined VCSEL is removed by dry etching so that the AlGaAs layer having an Al composition equal to or smaller than 50%, and the interlayer insulating film of, for example, $SiO_2$, SiON or $SiN_x$ is provided on the exposed AlGaAs layer resulting from the above removal. Thus, the interlayer insulating film is able to adhere to the coated surface, namely, the AlGaAs layer having an Al composition equal to or smaller than 50% with improved adhesiveness. It is therefore possible to prevent the interlayer insulating film from being removed from the coated surface or being broken down and scattered even when the wafer is subject to the high-temperature annealing process necessary for making the ohmic contact. Further, removal and breakdown of the interlayer insulating film can be prevented more effectively by dry etching with a gas containing fluorine or sulfur as the major component before the AlGaAs layer having an Al composition equal to or smaller than 50% is exposed to the atmosphere, because dry etching prevents formation of the natural oxidation film. As a result, the highly reliable and durable VCSEL devices can be produced at an improved yield.

More generally, according to an aspect of the present invention, in a semiconductor laser of a type in which part of the current confinement layer (or control layer) is oxidized to confine the current path, it is designed to remove the oxide layer on a semiconductor layer simultaneously formed in the step of forming the current confinement layer due to oxidization. It is therefore possible to enhance the adhesiveness between the exposed semiconductor layer revealed after removal of the oxide layer and the interlayer insulating film. Particularly, in the surface emitting semiconductor laser of the vertical cavity type having the mesa structure, the interlayer insulating film can securely adhere to the semiconductor layer exposed after removal of the oxide film, so that the interlayer insulating film can be prevented from being partially or totally removed from the exposed semiconductor layer and the mechanical strength of the post structure can be improved. As a result, it is possible to prevent occurrence of electric failures of the electrical connection between the wiring layer formed through the insulating film and the contact layer of the post structure and to produce the highly reliable and durable VCSEL devices at an improved yield.

The present invention is not limited to the specifically disclosed embodiments and examples, and other embodiments and variations may be made without departing from the scope of the present invention.

What is claimed is:

1. A surface emitting semiconductor laser comprising:
a substrate;
a first semiconductor multilayer reflector formed on the substrate;
an active region formed on the first semiconductor multilayer reflector;
a second semiconductor multilayer reflector formed on the active region;
a current confinement layer interposed between the first and second semiconductor multilayer reflectors and partially including an oxide region; and
an insulating layer formed on a coated surface provided by at least one semiconductor layer which is part of the first semiconductor multilayer reflector and is revealed after removal of a surface oxidation layer, said at least one semiconductor layer having an Al composition equal to or smaller than 50%.

2. The surface emitting semiconductor layer according to claim 1, wherein:
the first semiconductor multilayer reflector is a distributed Bragg reflector composed of alternatively laminating semiconductor layers having different Al compositions.

3. The surface emitting semiconductor laser according to claim 1, wherein the distributed Bragg reflector comprises one of $Al_xGa_{1-x}As$ and $Al_xGa_{1-x}N$.

4. The surface emitting semiconductor laser according to claim 1, wherein the semiconductor layer of the first multilayer reflector is thicker than other semiconductor layers thereof.

5. The surface emitting semiconductor laser according to claim 4, wherein the semiconductor layer comprises a region that has an optical thickness defined by a product of n and d, the product being equal to an odd-number multiple of a length equal to ¼ of a wavelength of laser oscillation where d denotes a thickness of the semiconductor layer, and n denotes a refractive index thereof.

6. The surface emitting semiconductor laser according to claim 1, wherein the active region comprises a multiquantum well structure and spacer layers on both sides thereof.

7. The surface emitting semiconductor laser according to claim 1, wherein the surface oxidation layer has been removed by dry etching.

8. A surface emitting semiconductor laser comprising:
a substrate;
semiconductor layers laminated on the substrate in turn, the semiconductor layers includes a first reflector having a first electrical conduction type, an active region on the first reflector, at least one current confinement partially including an oxide region, and a second reflector having a second electrical conduction type;
a mesa at least extending from the second reflector to the current confinement region,
a bottom of the mesa having a coated surface that is provided by at least one semiconductor layer having an Al composition equal to or smaller than 50% and is revealed after removal of a surface oxidation layer, an insulating film being provided on the coated surface.

9. The surface emitting semiconductor laser according to claim 8, wherein the insulating layer covers at least a sidewall and the bottom of the mesa.

10. A surface emitting semiconductor laser comprising:
a substrate;
a first semiconductor multilayer reflector formed on the substrate;
an active region formed on the first semiconductor multilayer reflector;
a pair of spacer layers that sandwich the active layer;
a second semiconductor multilayer reflector formed on the active region;
a current confinement layer interposed between the first and second semiconductor multilayer reflectors and partially including an oxide region, a mesa structure ranging at least from the second semiconductor multilayer reflector to the current confinement layer being defined; and
a bottom of the mesa structure having at least a first one of the pair of spacer layers that is in the absence of an oxide layer and has an Al composition equal to or smaller than 50%.

11. The surface emitting semiconductor laser according to claim 10, further comprising an insulating layer covering at least a sidewall and the bottom of the mesa structure.

* * * * *